United States Patent
Wu et al.

(10) Patent No.: US 12,431,598 B2
(45) Date of Patent: Sep. 30, 2025

(54) BATTERY DISCONNECT UNIT

(71) Applicant: Wuhan Jason Electronics Technology Co., Ltd., Wuhan (CN)

(72) Inventors: Hao Wu, Wuhan (CN); Xiaoyong Pu, Wuhan (CN)

(73) Assignee: Wuhan Jason Electronics Technology Co., Ltd., Wuhan (CN)

( * ) Notice: Subject to any disclaimer, the term of this patent is extended or adjusted under 35 U.S.C. 154(b) by 0 days.

(21) Appl. No.: 19/035,762

(22) Filed: Jan. 23, 2025

(65) Prior Publication Data

US 2025/0174852 A1 May 29, 2025

(30) Foreign Application Priority Data

Jan. 10, 2025 (CN) .......................... 202510043937.5

(51) Int. Cl.
*G01R 31/364* (2019.01)
*H01M 50/507* (2021.01)
*H01M 50/583* (2021.01)

(52) U.S. Cl.
CPC ........ *H01M 50/583* (2021.01); *G01R 31/364* (2019.01); *H01M 50/507* (2021.01)

(58) Field of Classification Search
CPC .. G01R 31/364; H01L 27/116; H01M 50/583; H01M 50/507; H01H 50/546; Y02E 60/10

(Continued)

(56) References Cited

U.S. PATENT DOCUMENTS

| | | | |
|---|---|---|---|
| 2018/0190960 A1* | 7/2018 | Harris | ................... H01M 50/20 |
| 2024/0014453 A1 | 1/2024 | Gu | |
| 2024/0154273 A1 | 5/2024 | Jang | |

FOREIGN PATENT DOCUMENTS

| | | |
|---|---|---|
| CN | 112888159 B | 10/2022 |
| CN | 111935897 B | 5/2024 |

\* cited by examiner

*Primary Examiner* — Timothy J Thompson
*Assistant Examiner* — Guillermo J Egoavil

(57) ABSTRACT

The present disclosure proposes a battery disconnect unit, and relates to the technical field of batteries. The battery disconnect unit includes an electrical element and an electric connection assembly. The electric connection assembly includes first conducting bars and second conducting bars. A number of first conducting bars and a number of second conducting bars are arranged. The first conducting bar includes a first conducting piece body and a first connection portion connected to each other. The second conducting bar includes a second conducting piece body and a second connection portion connected to each other. A number of first conducting piece bodies and a number of second conducting piece bodies are arranged at intervals on respective planar layers. The first connection portions and the second connection portions are electrically connected to the electrical element respectively. The planar layer where the first conducting piece bodies are located and the planar layer where the second conducting piece bodies are located are set in a stacked manner, so that arrangement areas of the conducting pieces on the respective planar layers are extended, and the connection portions are connected to the electrical element, which avoids occupying an additional perpendicular space, making an overall layout more compact, and realizing a light and thin design of the battery disconnect unit.

11 Claims, 14 Drawing Sheets

(58) Field of Classification Search
USPC .................................................. 361/775, 776
See application file for complete search history.

BATTERY DISCONNECT UNIT

TECHNICAL FIELD

The present application relates to the technical field of batteries, in particular to a battery disconnect unit.

BACKGROUND

With the continuous development of high-voltage battery technologies such as electric vehicles and energy storage systems, a battery disconnect unit (BDU) plays a crucial role as one of core components in a battery management system. The BDU is mainly configured to safely disconnect a battery from an electrical system in a case of a battery failure or emergency, so as to protect the battery from the impact of a short circuit, an overload and other electrical failures. The BDU usually contains electrical elements such as a relay, a fuse, a contactor, etc., which are configured to realize the control and protection of a battery circuit.

However, the design of existing BDUs still has certain technical shortcomings, especially in terms of internal space utilization and volume optimization. Due to a large number of electrical elements integrated inside the BDU, in order to realize an electrical connection between the elements, it is usually necessary to use metal conducting bars, and the design and arrangement of the metal conducting bars in the BDU is a key issue. In the traditional BDU design, most of these electrical elements are arranged horizontally, and the metal conducting bars are connected by dividing them into positive and negative poles.

However, the layout of horizontal arrangement faces a problem of space limitation in the design. Due to space limitations, a width of the metal conducting bars often cannot be made large enough, and a current carrying capacity must be ensured by increasing their thickness. This design manner leads to an overall bulky volume of the electrical elements inside the BDU after assembly, making it difficult to realize a goal of lightness and thinness. In addition, the small width of the design of the metal conducting bars limits a space for optimization of the electrical connection, which may lead to degradation of an electrical performance or poor heat dissipation, thus affecting the safety and reliability of the BDU.

SUMMARY

In view of this, the present application proposes a battery disconnect unit to solve the problem that in the prior art, a design and arrangement manner of the metal conducting bars inside a BDU in the prior art will lead to an overall bulky volume of the BDU after assembly, making it possible to realize lightness and thinness.

A technical solution of the present application is realized in this way.

The present application provides a battery disconnect unit, including:
an electrical element; and
an electric connection assembly, including first conducting bars and second conducting bars. A number of first conducting bars and a number of second conducting bars are arranged. The first conducting bar includes a first conducting piece body and a first connection portion connected to the first conducting piece body. The second conducting bar includes a second conducting piece body and a second connection portion connected to the second conducting piece body. A number of the first conducting piece bodies are arranged at intervals on the same planar layer. A number of the second conducting piece bodies are arranged at intervals on the same planar layer, and the planar layer where the first conducting piece bodies are located and the planar layer where the second conducting piece bodies are located are set in a stacked manner. The first connection portions and the second connection portions are electrically connected to the electrical element respectively.

Based on the above technical solution, preferably, the battery disconnect unit further includes an upper shell body. The upper shell body has a hole. A plurality electrical elements are arranged. The plurality of electrical elements are fixedly arranged at intervals on one side of the upper shell body. The first conducting piece bodies and the second conducting piece bodies are located on the other side of the upper shell body. The first connection portions and the second connection portions are electrically connected to the electrical elements through the hole respectively.

Based on the above technical solution, preferably, an insulating layer is arranged between the first conducting piece body and the second conducting piece body.

Based on the above technical solution, preferably, a heat dissipation layer is further arranged between the first conducting piece body and the second conducting piece body. The insulating layer includes an upper insulating layer and a lower insulating layer. The heat dissipation layer is located between the upper insulating layer and the lower insulating layer.

Based on the above technical solution, preferably, a thickness of both the first conducting piece body and the second conducting piece body is 0.3 mm-3 mm.

Based on the above technical solution, preferably, an auxiliary conducting piece is fixedly arranged at an electrical connection of the first connection portion or the second connection portion and the electrical element.

Based on the above technical solution, preferably,
a first conducting connection piece is arranged between the first connection portions electrically connected to the two electrical elements on the first conducting bar, and two ends of the first conducting connection piece are electrically connected to the electrical elements respectively.

A second conducting connection piece is arranged between the second connection portions electrically connected to the two electrical elements on the second conducting bar, and two ends of the second conducting connection piece are electrically connected to the electrical elements respectively.

Based on the above technical solution, preferably, the first conducting piece body has at least one vertically arranged first pin. The second conducting piece body has at least one vertically arranged second pin. A surface of the upper shell body has at least one connection seat. The first pin and the second pin both penetrate through the upper shell body and are located in the connection seat.

Based on the above technical solution, preferably, the first connection portion includes a first vertical piece body connected to the first conducting piece body. The second connection portion includes a second vertical piece body connected to the second conducting piece body. The electrical element includes a plurality of relays. The first vertical piece body and the second vertical piece body are electrically connected to electric connection points of the relays respectively when the electric connection points of the relays are located on a side wall.

Based on the above technical solution, preferably, the battery disconnect unit further includes a bottom shell. The bottom shell is arranged on a side of the electric connection assembly away from the upper shell body. The bottom shell is provided with a plurality of first connection columns and second connection columns. The first connection columns and the second connection columns all penetrate through the first conducting piece bodies, the second conducting piece bodies, and the upper shell body and extend out of an outer side of the upper shell body.

At least part of the first connection portions further includes a first horizontal piece body. The first horizontal piece body is perpendicularly connected to an end of the first vertical piece body away from the first conducting piece body. The first horizontal piece body is fixedly connected to an end face of the first connection column.

At least part of the second connection portions further includes a second horizontal piece body. The second horizontal piece body is perpendicularly connected to an end of the second vertical piece body away from the second conducting piece body. The second horizontal piece body is fixedly connected to an end face of the second connection column.

Based on the above technical solution, preferably, the electrical element further includes at least one fuse. The fuse has a first electric connection end and a second electric connection end arranged opposite to each other. A surface of the upper shell body has a first support portion. The first electric connection end is fixedly arranged on the first support portion. The second electric connection end is arranged on a top face of the first horizontal piece body. The second electric connection end is fixedly connected to the first horizontal piece body through the first connection column.

Based on the above technical solution, preferably, the electrical element further includes a current sensor. A surface of the upper shell body has a second support portion. One end of the current sensor is horizontally fixed to the second support portion. The other end of the current sensor is horizontally arranged on a top face of the second horizontal piece body. The end of the current sensor away from the second support portion is fixedly connected to the second horizontal piece body through the second connection column.

Compared with the prior art, the present application has the following beneficial effects.

(1) A number of the first conducting piece bodies are arranged at intervals on the same planar layer, a number of the second conducting piece bodies are arranged at intervals on the same planar layer, and the planar layer where the first conducting piece bodies are located and the planar layer where the second conducting piece bodies are located are set in the stacked manner, so that arrangement areas of these conducting pieces on the respective planar layers are extended, making their arrangement more compact. As a result of this arrangement manner, the first conducting piece bodies and the second conducting piece bodies no longer occupy additional perpendicular space, which effectively improves the utilization of an internal space of the battery disconnect unit. At the same time, the first connection portions and the second connection portions are electrically connected to the electrical elements, avoiding a cross layout of the plurality of electrical elements and conducting bars in the same horizontal direction, thereby making an entire structure of the battery disconnect unit more compact, lighter and thinner. Compared with a conventional arrangement, such a design not only saves more internal space, but also can effectively improve an overall performance of the battery pack and meet the design requirements of high energy density and light weight.

(2) The first conducting piece bodies and the second conducting piece bodies are located in a stacked manner on the side of the upper shell body away from the electrical elements, are arranged more compactly, and do not occupy a larger space in a vertical direction inside the upper shell body, while the electrical elements are located on the other side of the upper shell body, and the first connection portions and the second connection portions penetrate through the top face of the upper shell body, and after being connected to the electrical elements, do not occupy the internal space of the upper shell in the vertical direction, so that an overall thickness of the entire battery disconnect unit is basically determined by a total thickness of the electrical elements and the upper shell body, thus realizing a light and thin design.

(3) The upper insulating layer, the heat dissipation layer, and the lower insulating layer are arranged and designed in a stacked manner, such a design is not only structurally compact, but also can effectively utilize the space, and at the same time, a heat dissipation function and an electrical isolation function are combined together. Compared with a conventional heat dissipation solution, such a multi-layer design ensures more efficient thermal management while maintaining a small volume and a light weight.

(4) The auxiliary conducting pieces are fixedly arranged at the electrical connections of the first connection portions or the second connection portions and the electrical elements, so that conducting cross-sectional areas of the connections of the connection portions and the electrical elements may be significantly increased, and a heat conduction path may also be extended. More heat may be conducted faster through these auxiliary conducting pieces to the first conducting piece bodies and the second conducting piece bodies, then heat is dissipated outwards through the heat dissipation layers, and such a multi-path conduction manner can reduce a temperature of the electrical connections of the electrical elements more effectively.

(5) The first conducting connection pieces and the second conductive connection pieces are arranged between the connection portions of the first conducting bars and the second conducting bars, this solution not only optimizes the electrical connection between the electrical elements and the conducting bars, improves current transmission efficiency, and reduces an internal resistance, but also effectively improves a heat dissipation ability, controls a temperature rise, and realizes temperature homogenization of the electrical elements. Compared with a method of increasing a thickness of a conducting bar, increasing the conducting connection pieces can achieve a purpose of optimizing current conduction and heat dissipation without increasing vertical space occupation, and at the same time meet the lightweight design requirements.

(6) The first pin is directly stamped and formed on the first conducting bar, the second pin is stamped and formed on the second conducting bar, the connection seat is arranged on the top face of the upper shell body, the first pin and the second pin both penetrate vertically upwards through the top face of the upper shell and are fixed in the connection seat, thereby facilitating the insertion of external high-voltage sampling terminals into the connection seat, the sampling terminals are electrically connected to the first pin and the second pin to obtain high-voltage signals of the relays, and such a structural design makes a manner of obtaining high-voltage sampling models of the relays simple and reliable.

(7) The first connection columns and the second connection columns are arranged on the bottom shell to ensure that at least one electric connection end of some electrical elements can be stably connected to the bottom shell through the above connection columns, at the same time a structural form of part of the first connection portions and the second connection portions is adjusted, different types of electrical elements may be flexibly electrically connected, and it is convenient to establish an assembly connection relationship between the electrical elements through the first connection portions and the second connection portions, so that the electrical elements may be flexibly assembled in the battery disconnect unit.

BRIEF DESCRIPTION OF THE DRAWINGS

In order to explain technical solutions in embodiments of the present application or the prior art more clearly, accompanying drawings that need to be used in descriptions of the embodiments or the prior art will be briefly introduced below. Apparently, the accompanying drawings in the following descriptions are only some embodiments of the present application, and for those of ordinary skill in the art, on the premise of no creative work, other accompanying drawings may further be obtained from these accompanying drawings.

Figure 1:
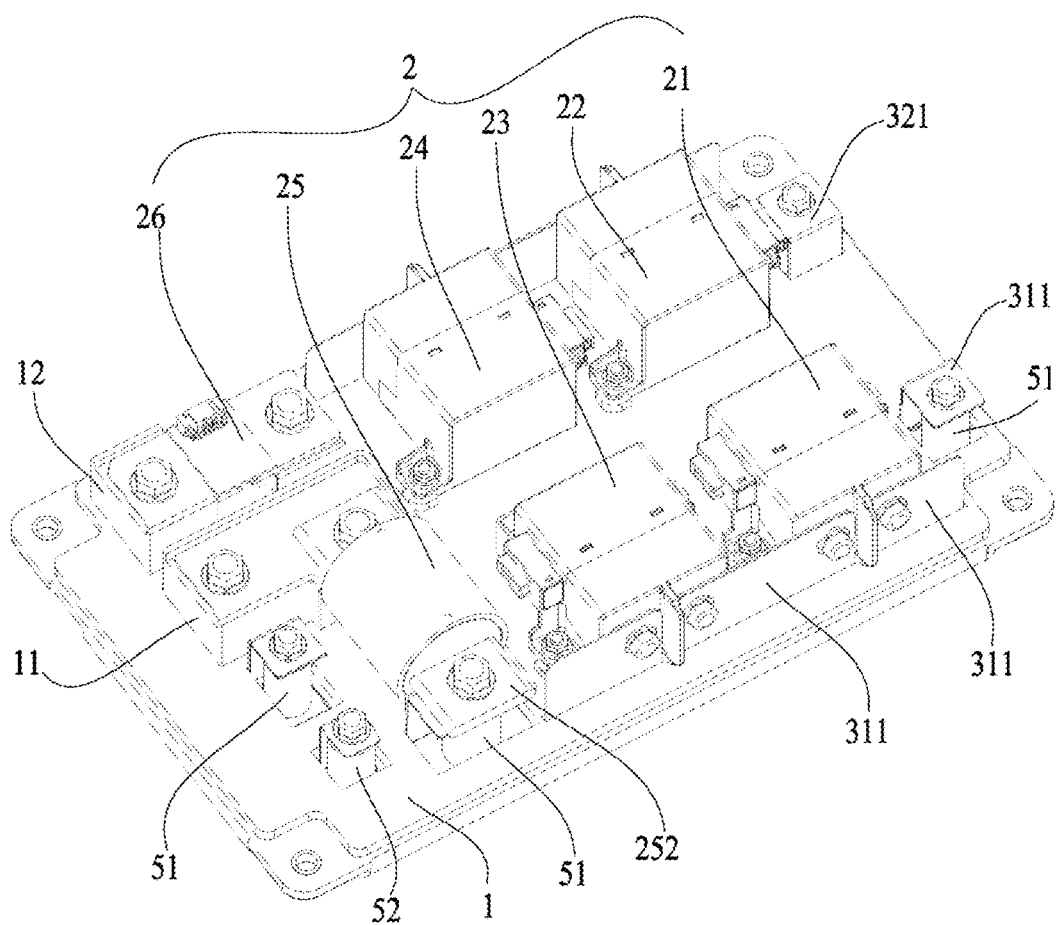
FIG. 1 is a schematic diagram of a first view three-dimensional structure of a battery disconnect unit disclosed by the present application.

REFERENCE NUMERALS 1, upper shell body; 10, hole; 11, first support portion; 12, second support portion; 13, connection seat; 2, electrical element; 21, fast charging positive relay; 22, fast charging negative relay; 23, main positive relay; 24, main negative relay; P, electric connection point; 25, fuse; 251, first electric connection end; 252, second electric connection end; 26, current sensor;

3, electric connection assembly; 31, first conducting bar; 310, first conducting piece body 311, first connection portion; 3111, first vertical piece body; 3112, first horizontal piece body; 312, first pin;

32, second conducting bar; 320, second conducting piece body; 321, second connection portion; 3211, a second vertical piece body; 3212, second horizontal piece body; 322, second pin;

33, auxiliary conducting piece; 34, first conducting connection piece; 35, second conducting connection piece;

4, insulating layer; 41, upper insulating layer; 42, lower insulating layer;

5, bottom shell; 51, first connection column; 52, second connection column;

6, heat dissipation layer; and 61, heat conducting portion.

DETAILED DESCRIPTION OF THE EMBODIMENTS

Technical solutions in implementations of the present application will be clearly and completely described below in conjunction with the implementations of the present application, and it is obvious that the described implementations are only a part of the implementations of the present application but not all of them. Based on the implementations in the present application, all other implementations obtained by those of ordinary skill in the art without making creative work belong to the protection scope of the present application.

Figure 2:
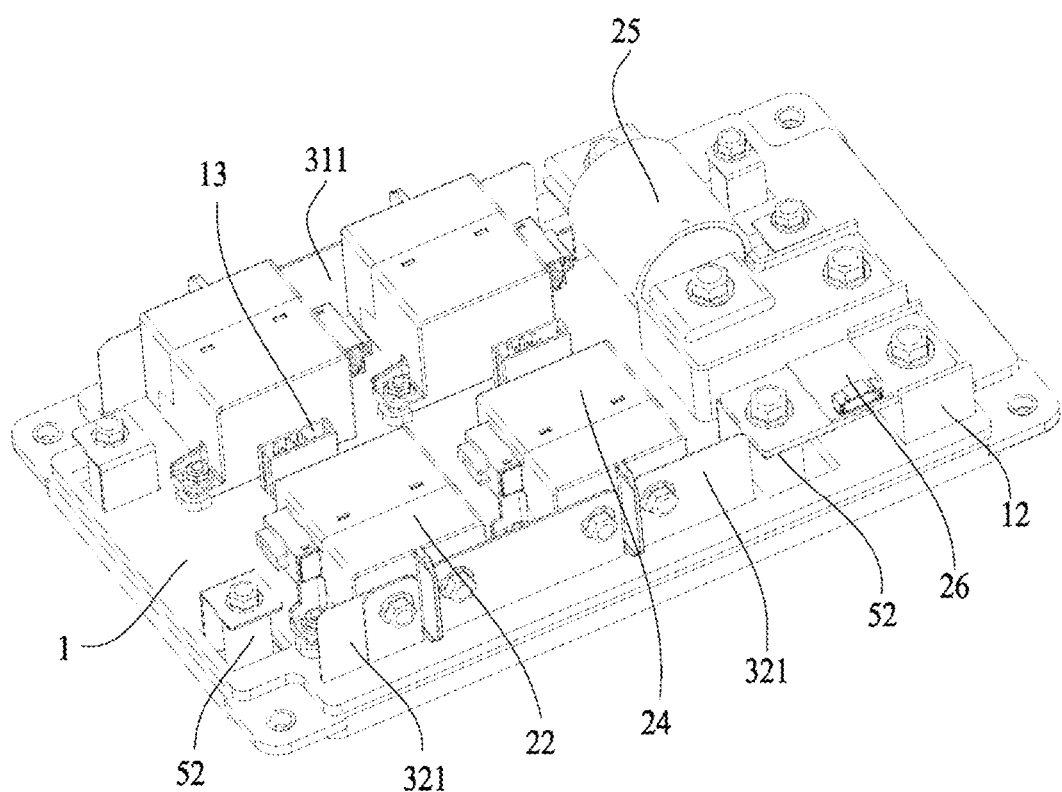
FIG. 2 is a schematic diagram of a second view three-dimensional structure of a battery disconnect unit disclosed by the present application.
Figure 3:
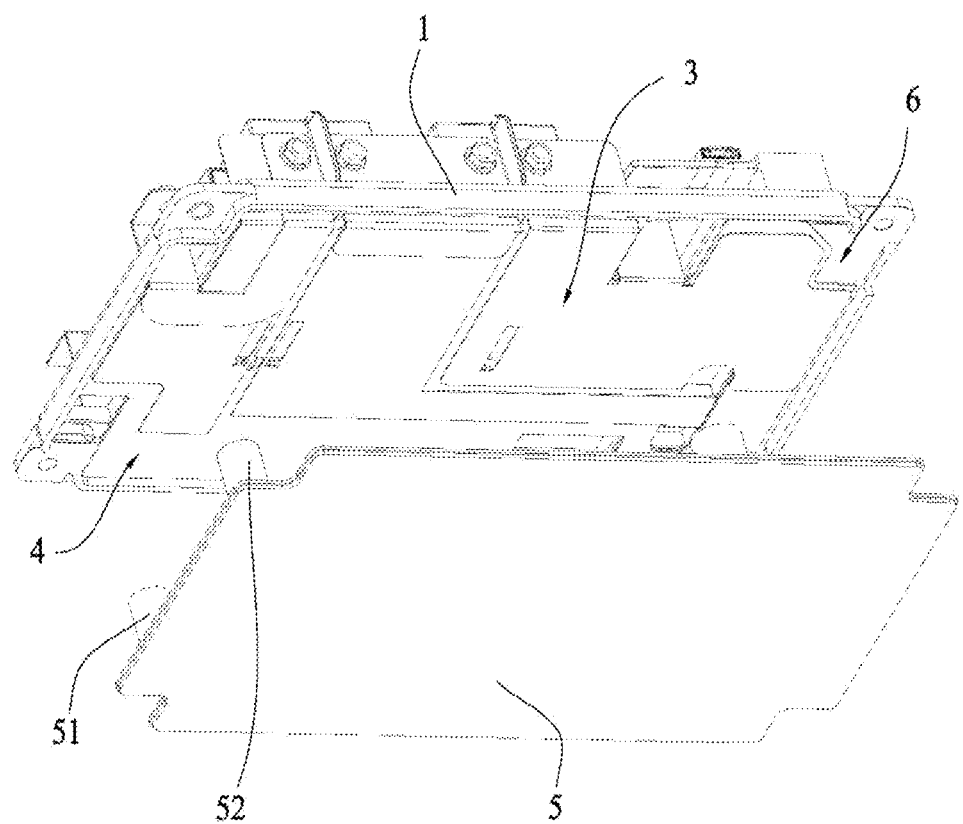
FIG. 3 is a schematic diagram of an internal structure of a battery disconnect unit disclosed by the present application.
Figure 4:
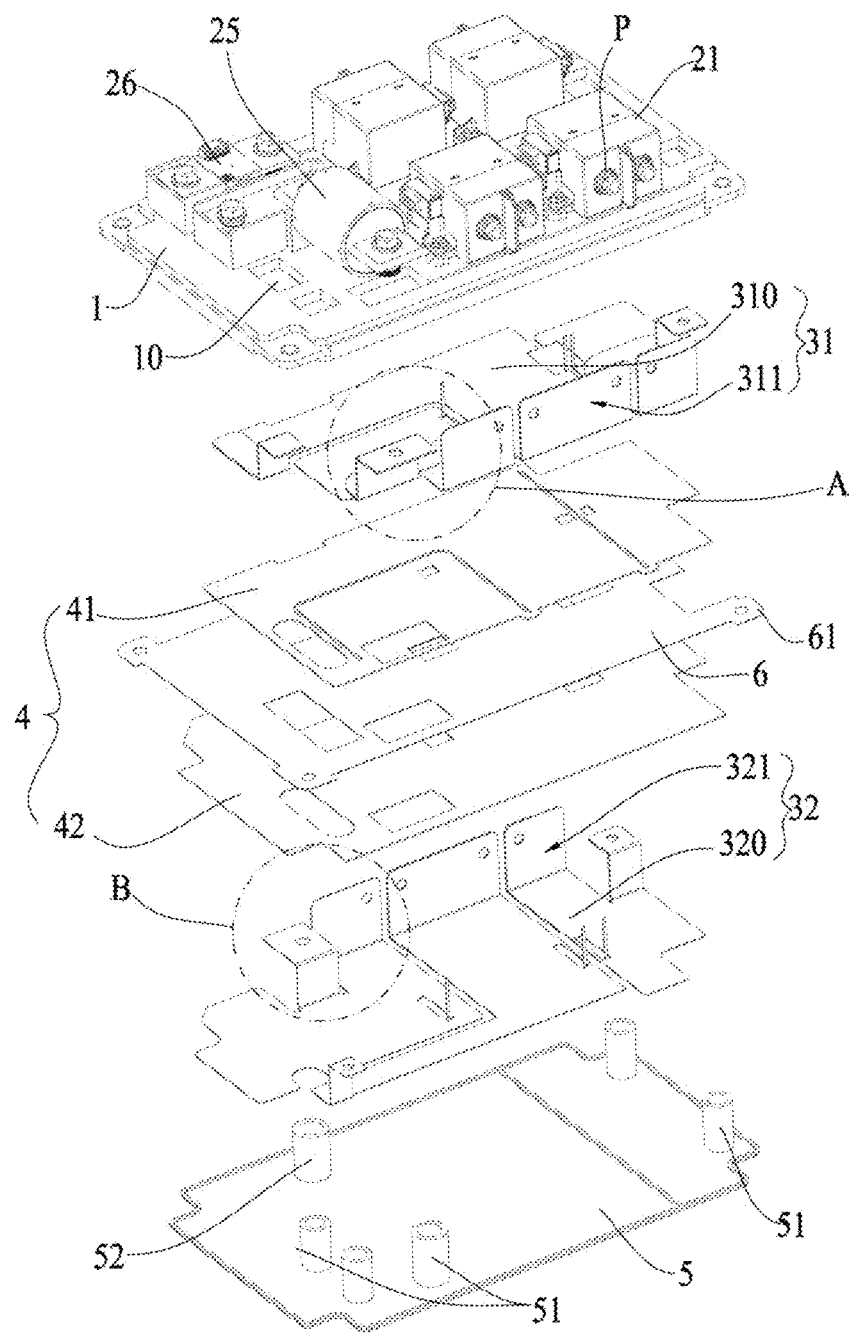
FIG. 4 is an exploded view of a battery disconnect unit disclosed by the present application.

As shown in FIG. 1, in conjunction with FIGS. 2-4, an embodiment of the present application discloses a battery disconnect unit including electrical elements 2 and an electric connection assembly 3.

The electrical elements 2 are configured for electrical control and protection of a battery pack, and a number of these electrical elements 2 are arranged, which may be key parts such as relays, fuses 25, contactors and the like. In some implementations, these electrical elements 2 are installed in the battery pack unit.

The electric connection assembly 3 includes first conducting bars 31 and second conducting bars 32. A number of first conducting bars 31 and a number of second conducting bars 32 are arranged, which is to realize the establishment of an electrical connection between the plurality of electrical elements 2. For ease of differentiation, in this embodiment, the first conducting bars 31 are defined as positive conducting bar, accordingly, the second conducting bars 32 are defined as negative conducting bars, and in some other embodiments, polarities of the first conducting bars 31 and the second conducting bars 32 may be interchanged.

As electrical communication is required between the plurality of electrical elements 2, the plurality of first conducting bars 31 and the plurality of second conducting bars 32 are arranged to use the plurality of first conducting bars 31 as positive conducting bars, and the plurality of second conducting bars 32 as negative conducting bars as an example. The plurality of first conducting bars 31 are configured to realize electrical communication between a part of the electrical elements 2 and to form a positive circuit, and the plurality of second conducting bars 32 are configured to realize electrical communication between the other part of the electrical elements 2 and to form a negative circuit.

Of course, in some other implementations, the polarities of the first conducting bars 31 and the second conducting bars 32 may be the same, i.e., a part of the plurality of electrical elements 2 establishes a circuit through the first conducting bars 31, the other part of the electrical elements 2 establishes a circuit through the second conducting bars 32, and the polarities of the two circuits are the same.

The first conducting bar 31 includes a first conducting piece body 310 and a first conducting piece 310 connected to the first conducting piece body 311. The second conducting bar 32 includes a second conducting piece body 320 and a second connection portion 321 connected to the second conducting piece body (320). A number of first conducting piece bodies 310 are arranged at intervals on the same planar layer, a number of second conducting piece bodies 320 are arranged at intervals on the same planar layer, and the planar layer where the first conducting piece bodies 310 are located and the planar layer where the second conducting piece bodies 320 are located are set in a stacked mode. The first connection portions 311 and the second connection portions 321 are electrically connected to the electrical elements 2 respectively.

In this embodiment, the first conducting piece bodies 310 and the second conducting piece bodies 320 are all horizontally arranged conducting pieces, and these conducting pieces may be metal pieces such as copper pieces, aluminum pieces, and iron sheets, or semiconductor pieces having a conductive performance. As preferred, the first conducting piece bodies 310 and the second conducting piece bodies 320 of this embodiment are preferably copper pieces, which can improve an overcurrent capability and heat dissipation efficiency. The plurality of first conducting piece bodies 310 and the plurality of second conducting piece bodies 320 are on two different planar layers, so that arrangement areas of the plurality of first conducting piece bodies 310 and the plurality of second conducting piece bodies 320 on the respective planar layers can be extended to a greater extent, and they are not affected by each other. The planar layer where the first conducting piece bodies 310 are located and the planar layer where the second conducting piece bodies 320 are located are set in a stacked mode, so that these conducting piece bodies may be arranged more compactly, and an internal space of the battery disconnect unit may be effectively utilized.

It is worth noting that the same planar layer described in the above embodiment is understood to be that the plurality of first conducting piece bodies 310 are located in the same planar layer, the plurality of second conducting piece bodies 320 are located in the same planar layer, the plurality of first conducting piece bodies 310 are of the same height in the same planar layer, and are arranged at intervals on the same horizontal plane, and the plurality of second conducting piece bodies 320 are of the same height in the same planar layer, and are arranged at intervals on the same horizontal plane, which makes these conducting piece bodies more compactly arranged in the vertical direction.

The same planar layer may further be understood to be that a number of first conducting piece bodies 310 have a certain height difference in their planar layer, a number of second conducting piece bodies 320 have a certain height difference in their planar layer, and these height differences are limited and determined by an assembly process, but the height difference between the conducting piece bodies in the same planar layer is small, and a characteristic of a compact arrangement in the vertical direction is still met.

Compared with conventional positive conducting bars and negative conducting bars being arranged in the same horizontal direction, the arrangement manner of the first conducting piece bodies 310 and the second conducting piece bodies 320 of this embodiment is more compact, an arrangement density is greater than a conventional arrangement density in the same horizontal direction, so that the utilization efficiency of the space of the battery disconnect unit is improved, and at the same time, a usable area is effectively increased.

The arrangement areas of the first conducting piece bodies 310 and the second conducting piece bodies 320 are extended, so thicknesses of the first conducting piece bodies 310 and the second conducting piece bodies 320 may be designed to be thinner, conventionally the positive conducting bars and the negative conducting bars are arranged in the same horizontal direction at the same time, and area arrangements of the positive conducting bars and the negative conducting bars are limited due to a limited arrangement space, so that in order to ensure the overcurrent, their thicknesses are usually designed to be larger, usually 2-3 mm. This embodiment, however, by arranging the first conducting piece bodies 310 and the second conducting piece bodies 320 in a stacked manner, may reduce their thicknesses, designed thicknesses are 0.3 mm-3 mm, whereby, after an overall thicknesses of the first conducting piece bodies 310 and the second conducting piece bodies 320 is reduced, a weight becomes lighter, and less space is occupied in the battery disconnect unit, so as to make the whole battery disconnect unit lighter and thinner.

In this embodiment, the first conducting piece bodies 310 and the second conducting piece bodies 320 are located on one sides of the electrical elements 2 in the vertical direction, and taking the first conducting piece bodies 310 and the second conducting piece bodies 320 being located below the electrical elements 2 as an example, in order to realize that the first conducting piece bodies 310 and the second conducting piece bodies 320 establish electrical communication between the electrical elements 2, a solution adopted in this embodiment is as follows. The first conducting bar 31 is provided with the first connection portion 311 connected to the first conducting piece body 310, the second conducting bar 32 is provided with the second connection portion 321 connected to the second conducting piece body 320, the first connection portion 311 is located on the first conducting piece body 310, the second connection portion 321 is located on the second conducting piece body 320, and the first connection portion 311 and the second connection portion 321 are electrically connected to the electrical elements 2 respectively.

In the above embodiment, the first connection portion 311 and the first conducting piece body 310 are made of the same material, the second connection portion 321 and the second conducting piece body 320 are made of the same material, and taking the first conducting bar 31 as an example, the first connection portion 311 and the first conducting piece body 310 may form the first conducting bar 31 by adopting welding or other fixing manners.

As preferred, the first conducting bar 31 includes the first connection portion 311 and the first conducting piece body 310 that are integrally molded, and specifically, a stamping process may be adopted to realize that the first connection portion 311 protrudes on the first conducting piece body 310, so that the first connection portion 311 is also of a piece structure. In this way, the first connection portion 311 and the first conducting piece body 310 are in a perpendicular connection relationship, so that it is convenient that when the first conducting piece body 310 is on a bottom face of the electrical element 2, the first connection portion 311 may be upwards electrically connected to an electric connection point of the electrical element 2.

As some examples, in the battery disconnect unit, a plurality of electrical elements 2 are designed, a part of the electrical elements 2 is electrically connected through the first connection portions 311, and the other part of the electrical elements 2 is electrically connected through the second connection portions 321. For example, in two electrical elements 2 where positive circuits need to be established, by arranging two first connection portions 311 on a first conducting piece body 310, the two first connection portions 311 are connected to electric connection points on the two electrical elements 2 respectively, thereby realizing the establishment of positive circuit communication between the electrical elements 2 through the first conducting bar 31. Accordingly, in two electrical elements 2 where negative circuits need to be established, by arranging two second connection portions 321 on a second conducting piece body 320, the two second connection portions 321 are connected to electric connection points on the two electrical elements 2 respectively, thereby realizing the establishment of negative circuit communication between the electrical elements 2 through the second conducting bar 32.

The planar layer where the first conducting piece bodies 310 are located and the planar layer where the second conducting piece bodies 320 are located are set in the stacked mode, a number of first conducting piece bodies 310 are located on a planar layer, a number of second conducting piece bodies 320 are located on the other planar layer, thereby extending the arrangement areas of these conducting piece bodies in the respective planar layers and making their arrangements more compact. As a result of this arrangement manner, the first conducting piece bodies 310 and the second conducting piece bodies 320 no longer occupy additional perpendicular space, which effectively improves the utilization of an internal space of the battery disconnect unit. At the same time, the first connection portions 311 and the second connection portions 321 are electrically connected to the electrical elements 2, avoiding a cross layout of the plurality of electrical elements 2 and the conducting bars in the same horizontal direction, thereby making an entire structure of the battery disconnect unit more compact, lighter and thinner. Compared with a conventional arrangement, such a design not only saves more internal space, but also can effectively improve an overall performance of the battery pack and meet the design requirements of high energy density and light weight.

In addition, by the design of the first connection portion 311 and the second connection portion 321, when a current flows through the first connection portion 311 and the second connection portion 321, since the first connection portion 311 is directly connected to the first conducting piece body 310, and the second connection portion 321 is directly connected to the second conducting piece body 320, the current flows through the whole of the first conducting bar 31 and the second conducting bar 32, and a current conducting area increases, resulting in an improved current carrying capacity. The increased current conducting area helps to improve the current carrying capacity of the conducting bars and the connection portions, which reduces the resistance when the current passes through and avoids a heating problem caused by an excessive current density. In a high power application, improving the current conducting area is significant in improving the heat dissipation performance and electrical performance of a system, avoiding a failure or performance degradation due to overheating.

In order to realize the fixation of the electrical element 2, in this embodiment, an upper shell body 1 is also arranged, and the upper shell body 1 is made of an insulating material, which may serve to electrically isolate the electrical element 2 from the electric connection assembly 3.

Figure 10:
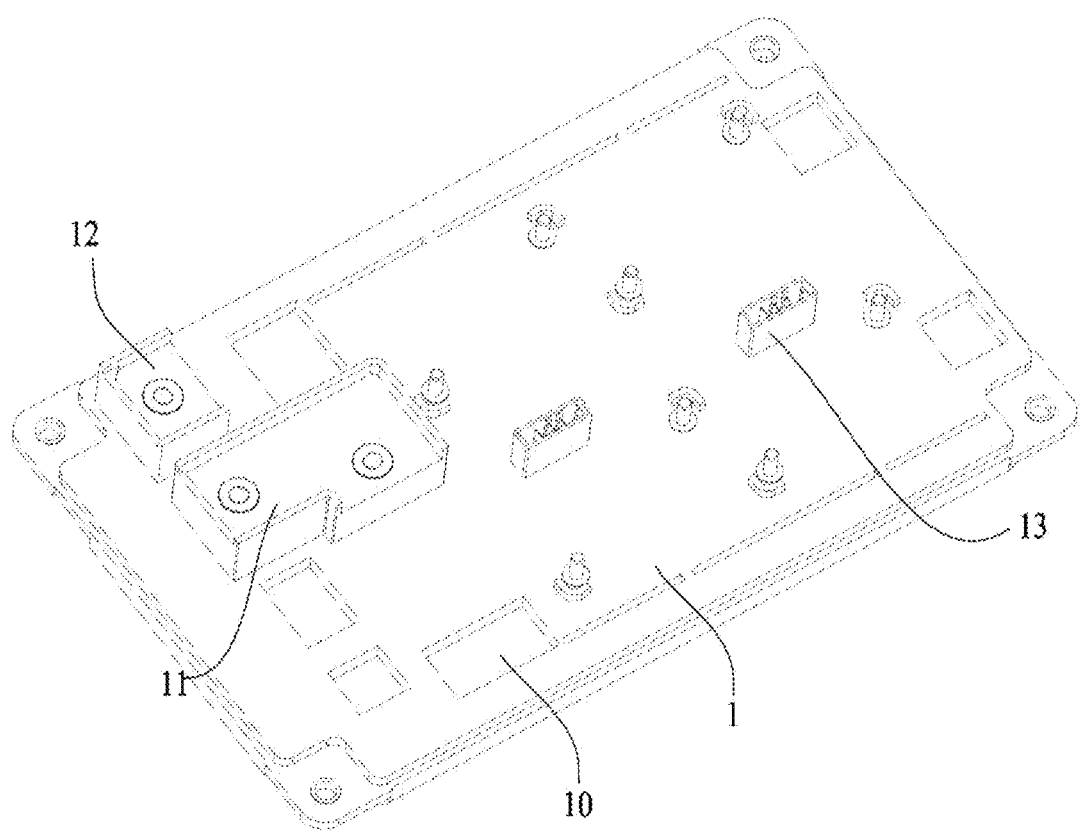
FIG. 10 is a schematic diagram of a three-dimensional structure of an upper shell body disclosed by the present application.

Referring to FIG. 4 and FIG. 10, the plurality of electrical elements 2 are fixedly arranged at intervals on one side of the upper shell body 1, the first conducting piece bodies 310 and the second conducting piece bodies 320 are located on the other side of the upper shell body 1, the upper shell body has holes 10, and the first connection portions 311 and the second connection portions 321 are electrically connected to the electrical elements 2 through these holes 10 respectively.

As some implementations, in order to realize a lighter and thinner overall battery disconnect unit, the plurality of electrical elements are fixedly arranged at intervals in a horizontal direction on one side of the upper shell body. By arranging the plurality of electrical elements 2 horizontally on one side of the upper shell body 1, assembly is thus facilitated, while avoiding that the electrical elements 2 are arranged in a stacked manner in a height direction, which results in a bulky volume of the battery disconnect unit. In addition, the plurality of electrical elements 2 are arranged at intervals in the horizontal direction to facilitate electrical communication between the electrical elements 2 through the electric connection assembly 3.

By forming the holes 10 in the upper shell body 1, it is convenient for the first connection portions 311 and the second connection portions 321 to penetrate through these holes 10 respectively to be electrically connected to the electrical elements arranged on the surface of the upper shell body 10. Of course, in some implementations, it is also possible for the electric connection points of the electrical elements to penetrate through these holes 10 to be electrically connected to the first connection portions 311 or the second connections 321 respectively.

The first conducting piece body 310 and the second conducting piece body 320 are located on the other side of the upper shell body 1. In some embodiments, the bottom face of the upper shell body 1 may be configured with an accommodating cavity, and the first conducting piece body 310 and the second conducting piece body 320 are accommodated in the above accommodating cavity in an up-down stacked manner. In this way, it may play a role in limiting a position of the electric connection assembly 3, at the same time avoid that an edge of the electric connection assembly 3 is exposed from an outer side of the upper shell body 1, and play a role in protecting the electric connection assembly 3.

In this embodiment, as a preferred implementation, the first connection portions 311 and the second connection portions 321 are electrically connected to the electrical elements 2 by penetrating through these holes 10 respectively, and thus, by the design that the first connection portions 311 and the second connection portions 321 penetrate through the upper shell body 1, an electrical connection may be efficiently established between a top and bottom of the upper shell body 1 without the need for arranging a complex conducting path on a horizontal plane, which allows the electrical elements 2 to be rationally arranged in a more compact space. In addition, it is worth noting that the first conducting piece bodies 310 and the second conducting piece bodies 320 are located in a stacked manner on the side of the upper shell body 1 away from the electrical elements 2, are arranged more compactly, and do not occupy a larger space in a vertical direction inside the upper shell body 1, while the electrical elements 2 are located on the other side of the upper shell body 1, and the first connection portions 311 and the second connection portions 321 penetrate through the top face of the upper shell body 1, and after being connected to the electrical elements 2, do not occupy the internal space of the upper shell 1 in the vertical direction, so that an overall thickness of the entire battery disconnect unit is basically determined by a total thickness of the electrical elements 2 and the upper shell body 1, thus realizing a lighter and thinner entire battery disconnect unit.

The first conducting bar 31 and the second conducting bar 32 are both energized with a high voltage current, and the first conducting piece body 310 and the second conducting piece body 320 are arranged in an up-down stacked manner, so there is a need to electrically isolate the first conducting piece body 310 and the second conducting piece body 320. In this embodiment, an insulating layer 4 is arranged between the first conducting piece body 310 and the second conducting piece body 320 to avoid a short circuit between the first conducting row 31 and the second conducting row 32.

In some implementations, the insulating layer 4 may be an insulating plate, an insulating coating, a ceramic coating, a resin layer, and other components, as long as it is possible to meet the electrical isolation of the first conducting piece body 310 and the second conducting piece body 320.

In addition, as some other implementations, the insulating layer 4 may be made of a material having a heat dissipation performance, such as a ceramic-based insulating material, heat conducting silicone, a polyimide (PI) composite material, and an epoxy resin. The integration of the heat dissipation function and the insulating function on the insulating layer 4 allows the design to be more compact, while keeping the thickness and weight low, making the battery disconnect unit lighter and thinner.

Referring to FIGS. 4, 11, 12, 13, and 14, a heat dissipation layer 6 is further arranged between the first conducting piece body 310 and the second conducting piece body 320, the insulating layer 4 includes an upper insulating layer 41 and a lower insulating layer 42, and the heat dissipation layer 6 is located between the upper insulating layer 41 and the lower insulating layer 42.

As some implementations, the upper insulating layer 41 may not be in contact with the first conducting piece body 310, and the lower insulating layer 42 may not be in contact with the second conducting piece body 320, while two faces of the heat dissipation layer 6 may or may not be in contact with the upper insulating layer 41 and the lower insulating layer 42, and it is only necessary to meet the electrical isolation and at the same time to be able to perform heat conduction. For example, heat released by the first conducting piece body 310 and the second conducting piece body 320 may be transferred through air into the insulating layer 4, and then transferred from the insulating layer 4 to the heat dissipation layer 6.

In some preferred implementations, the upper insulating layer 41 and the lower insulating layer 42 are in contact with the first conducting piece body 310 and the second conducting piece body 320 respectively, which may effectively isolate positive and negative conducting bars to avoid the occurrence of a short circuit. The upper insulating layer 41 and the lower insulating layer 42 act as insulating barriers and ensure the electrical isolation between the conducting bars, enhancing the electrical safety of the battery disconnect unit. The design of the heat dissipation layer 6 realizes effective heat management, which can effectively dissipate heat generated by a current passing through the conducting bars, avoiding a high internal temperature of the battery pack due to overheating of the electrical elements 2, which may affect the performance of the elements or lead to a failure.

In addition, a heat conducting portion 61 arranged at an edge of the heat dissipation layer 6 can direct the heat of the heat dissipation layer 6 to the outside, further enhancing the heat dissipation effect. Since the heat conducting portion 61 extends out of an outer side of the electric connection assembly 3, it may efficiently transfer heat to an external environment, ensuring that the battery disconnect unit maintains a stable temperature during a high-power operation and preventing a damage due to local overheating.

In the above embodiment, the upper insulating layer 41 and the lower insulating layer 42 may be selected from polytetrafluoroethylene (PTFF), polyimide (PI), and the like. The heat dissipation layer 6 may be selected from an aluminum-based heat dissipation piece, a copper-based heat dissipation piece, graphene, an aluminosilicate ceramic piece, a polymer-based heat conducting material, and the like.

The upper insulating layer 41, the heat dissipation layer 6, and the lower insulating layer 42 are arranged and designed in a stacked manner, such a design is not only structurally compact, but also can effectively utilize the space, and at the same time, a heat dissipation function and an electrical isolation function are combined together. Compared with a conventional heat dissipation solution, such a multi-layer design ensures more efficient thermal management while maintaining a small volume and a light weight.

It is worth noting that the upper insulating layer 41 and the lower insulating layer 42 merely indicate a distinction in a positional relationship, and in a practical application scenario, when the electrical element 2 is located at the top of the upper shell body 1, then the first conducting piece body 310 and the second conducting piece body 320 are located at the bottom of the upper shell body, so that the upper insulating layer 41 is then located at a bottom of the second conducting piece body 320; and when the electrical element 2 is located at the bottom of the upper shell body, the first conducting piece body 310 and the second conducting piece body 320 are located at the top of the upper shell body, such that the lower insulating layer 42 is then located at the top of the first conducting piece body 310.

In some other implementations, the heat dissipation layer 6 may be a liquid-cooling plate, and by circulating a cooling medium into the liquid-cooling plate, the heat released by the electrical element 2 may be transferred to the liquid-cooling plate through the conducting bar and the insulating layer 4, the heat is carried away by the cooling medium inside the liquid-cooling plate, and such a heat dissipation manner is more efficient.

During a charging and discharging process, the electric connections of the electrical elements 2 transmit high currents, which cause these electrical elements 2 to heat up, although the heat may be introduced into the first conducting piece bodies 310 and the second conducting piece bodies 320 through the electric connections of the electrical elements 2 via the first connection portions 311 and the second connection portions 321 respectively, and then be conducted outwards by the heat dissipation layer 6, heat conduction of the electrical elements 2 is still limited, especially at the electric connection of the electrical elements 2, which are heated due to the transmission of the high currents, the heat accumulates therein at a higher temperature, and the heat therein needs to be conduced downwards through the first connection portions 311 and the second connection portions 321. Since the first conducting piece body 310 and the first connection portion 311 are integrally molded, the second conducting piece body 320 and the second connection portion 321 are integrally molded, they are of an equal thickness design, and they are thin, the first connection portion 311 and the second connection portion 321 have a small overcurrent cross-sectional area, which makes the internal resistance become larger, and the temperature rise intensifies.

If the thicknesses of the first conducting bar 31 and the second conducting bar 32 are increased, the thicknesses of the first connection portion 311 and the second connection portion 321 will increase, although the overcurrent cross-sectional area of the first connection portion 311 and the second connection portion 321 becomes larger, the temperature rise problem may be alleviated, and as a result, the thicknesses of the first conducting piece body 310 and the second conducting piece body 320 will also increase, which will lead to larger occupation of a vertical space, which is not in line with the lightweight design requirements, and will also result in a high manufacturing cost at the same time.

Figure 5:
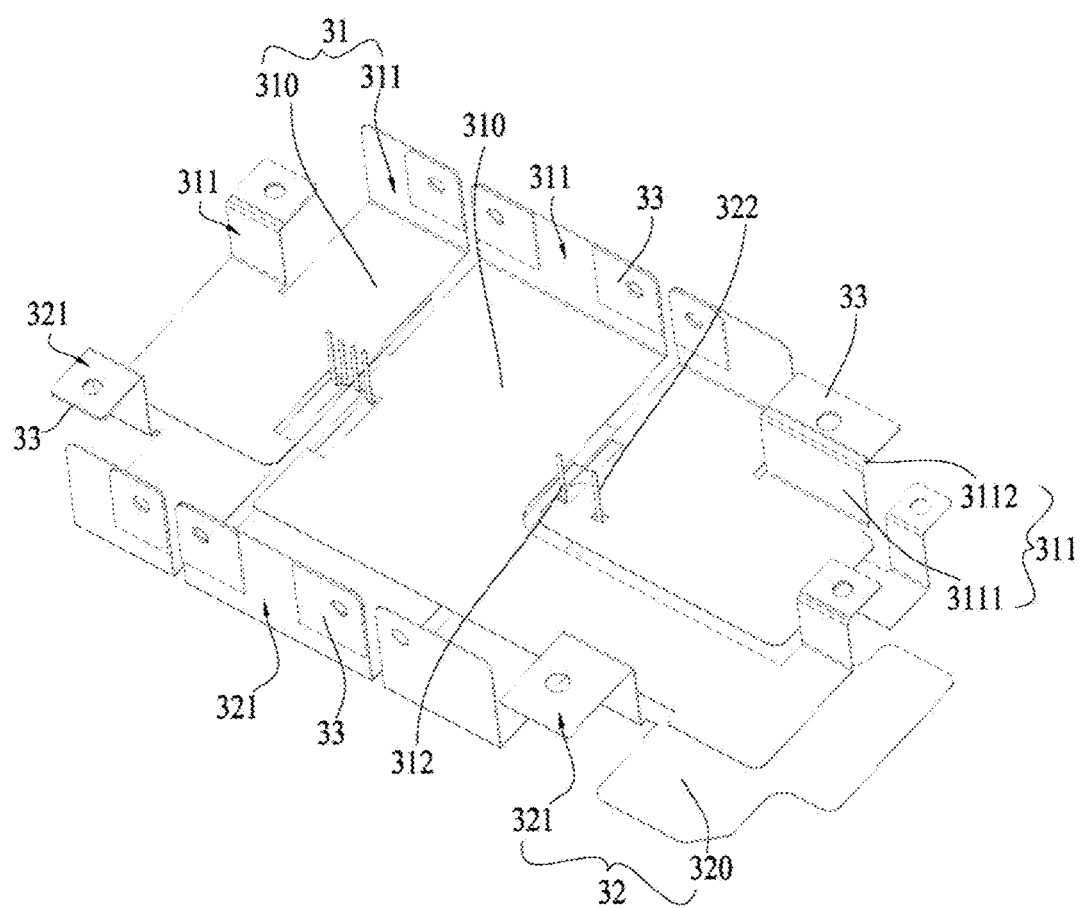
FIG. 5 is a first structural form of an electric connection assembly disclosed by the present application.
Figure 12:
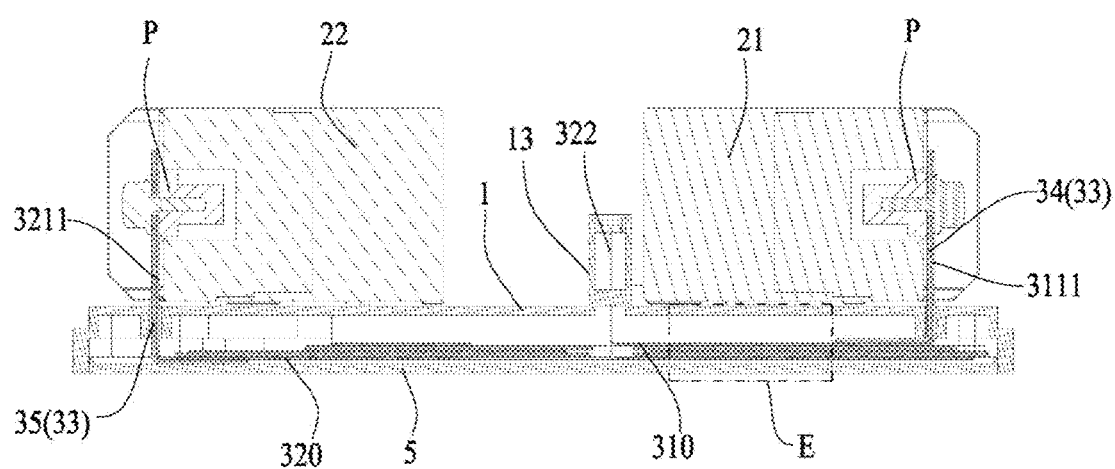
FIG. 12 is a planar sectional view at C-C of FIG. 11.

To this end, referring to FIG. 5 and FIG. 12, this embodiment adopts a solution of further improving the electric connection assembly 3.

Specifically, auxiliary conducting pieces 33 are fixedly arranged at electrical connections of the first connection portions 311 or the second connection portions 321 and the electrical elements 2. With this arrangement, heat conducting cross-sectional areas at the connections of the first connection portions 311 as well as the second connection portions 321 and the electrical elements 2 may be significantly increased. This directly reduces the internal resistance when the current passes through these parts, which reduces the temperature rise problem.

The added auxiliary conducting pieces 33 can not only increase a conducting cross-sectional area, but also extend the heat conducting path. More heat may be conducted faster through these auxiliary conducting pieces 33 to the first conducting piece bodies 310 and the second conducting piece bodies 320, then heat is dissipated outwards through the heat dissipation layers 6, and such a multi-path conduction manner can reduce a temperature of electrical connection ends of the electrical elements 2 more effectively.

The overall thickness of the conducting bar structure may be effectively controlled by adding the auxiliary conducting pieces 33, rather than directly increasing the thicknesses of the first connection portions 311 and the second connection portions 321. This meets the lightweight design requirements and reduces a manufacturing cost while maintaining a circuit performance. The addition of the auxiliary conducting pieces 33 is realized by fixing them to surfaces of the first connection portions 311 and the second connection portions 321, and such a design manner does not significantly increase the occupation of the vertical space. Compared with directly increasing the thickness of the conducting bar, this manner more rationally utilizes the existing space and makes the overall structure more compact.

In the above embodiment, the auxiliary conducting pieces 33 and the first conducting bar 31 and the second conducting bar 32 are made of the same or different materials, and all of them are made of conducting materials with a high heat dissipation performance. In this embodiment, the auxiliary conducting pieces 33 are preferably copper pieces, the thickness of the auxiliary conducting pieces 33 may be selected according to design needs correspondingly, for example, 0.5 mm-2 mm, and in addition the auxiliary conducting pieces 33 and the first connection portions 311 as well as the second connection portions 321 may be fixed in a welded, bonded or bolted connection manner.

The present application also adopts some other means to further improve the electric connection assembly 3 to solve the heat dissipation problem.

Figure 6:
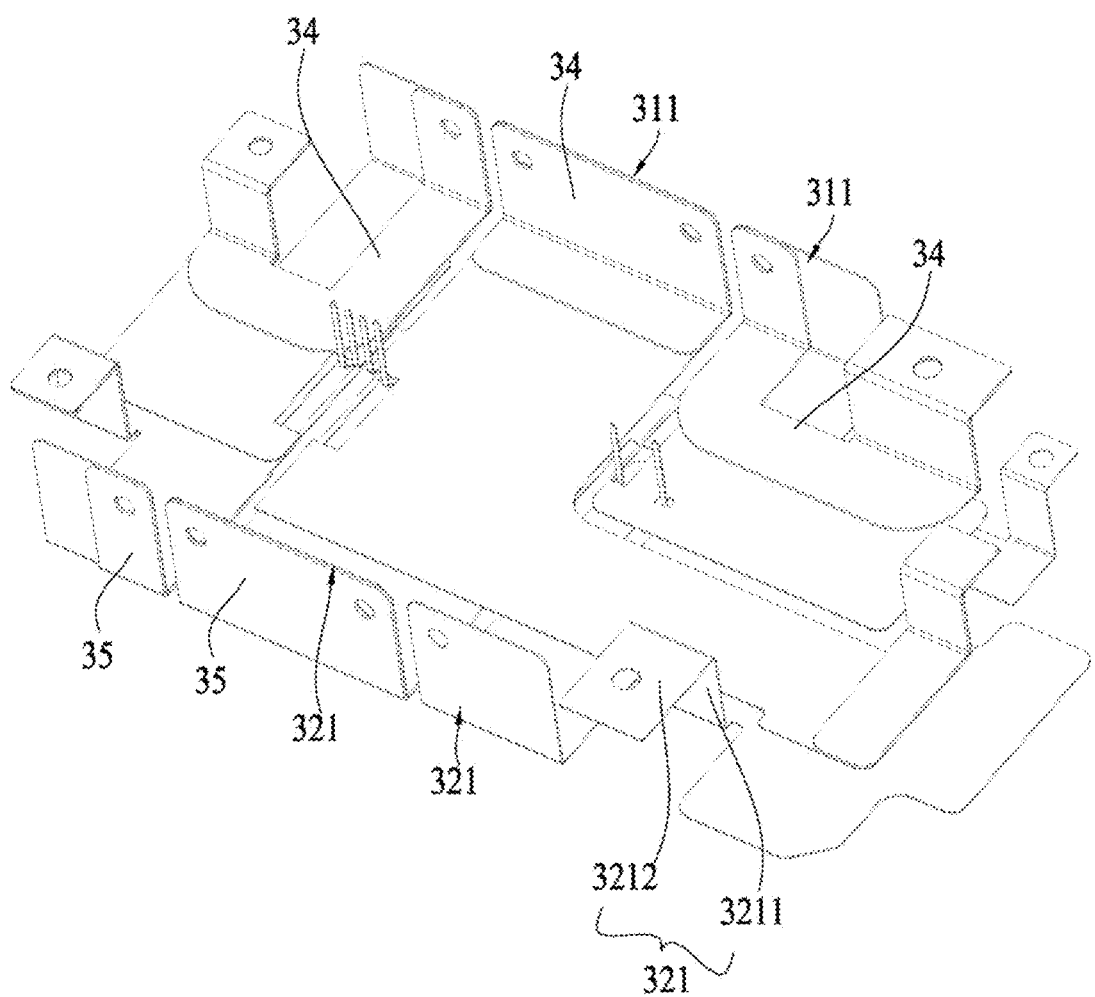
FIG. 6 is a front schematic diagram of a second structural form of an electric connection assembly disclosed by the present application.
Figure 7:
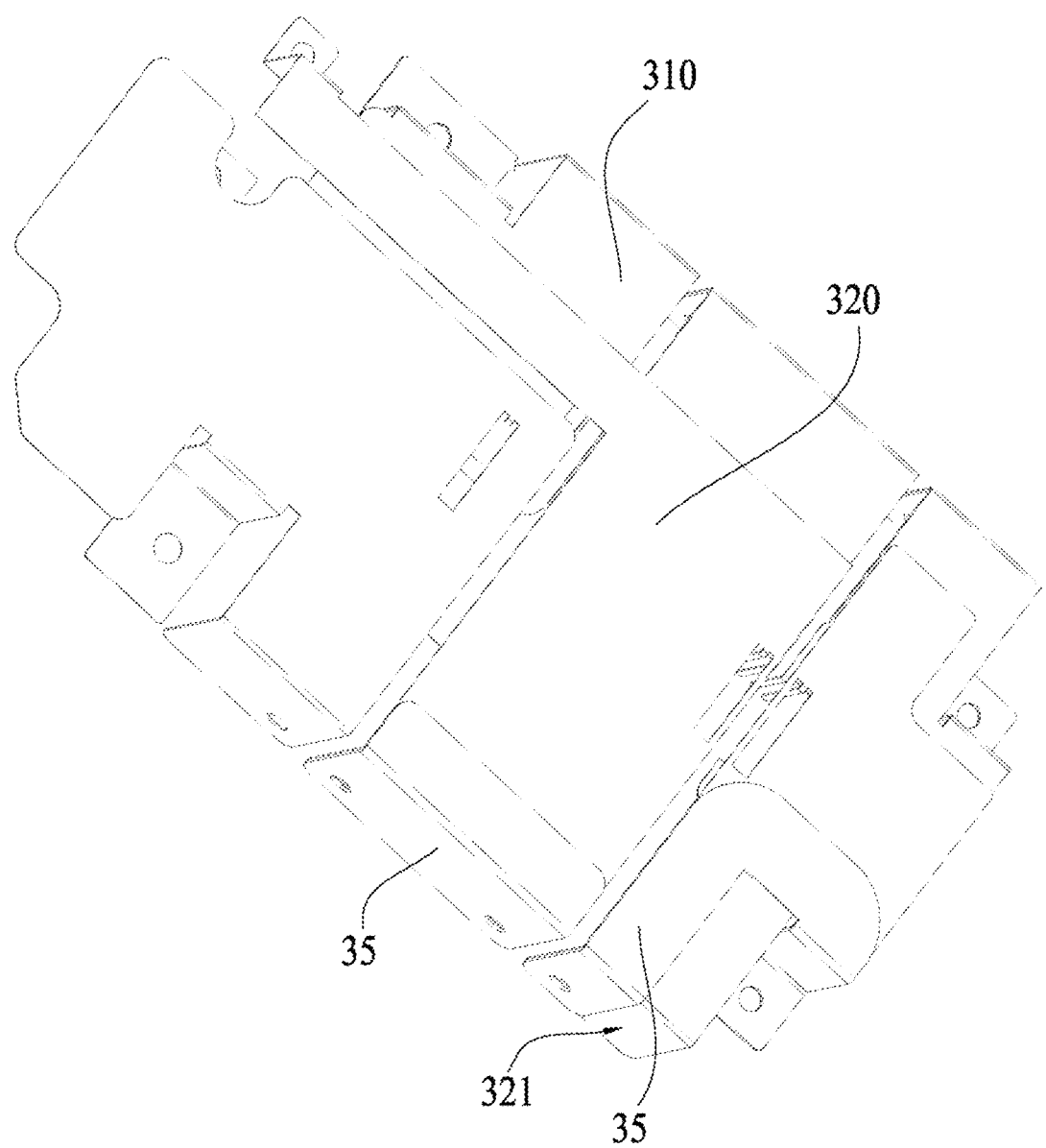
FIG. 7 is a back schematic diagram of a second structural form of an electric connection assembly disclosed by the present application.
Figure 8:
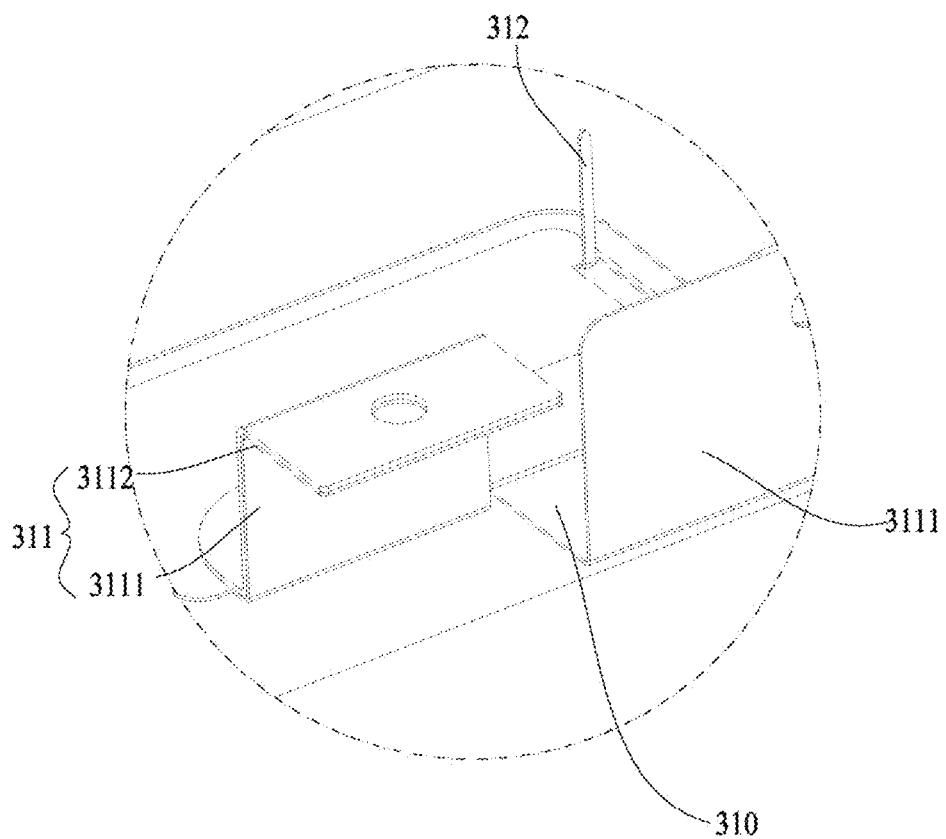
FIG. 8 is a partially enlarged diagram at A of FIG. 4.
Figure 9:
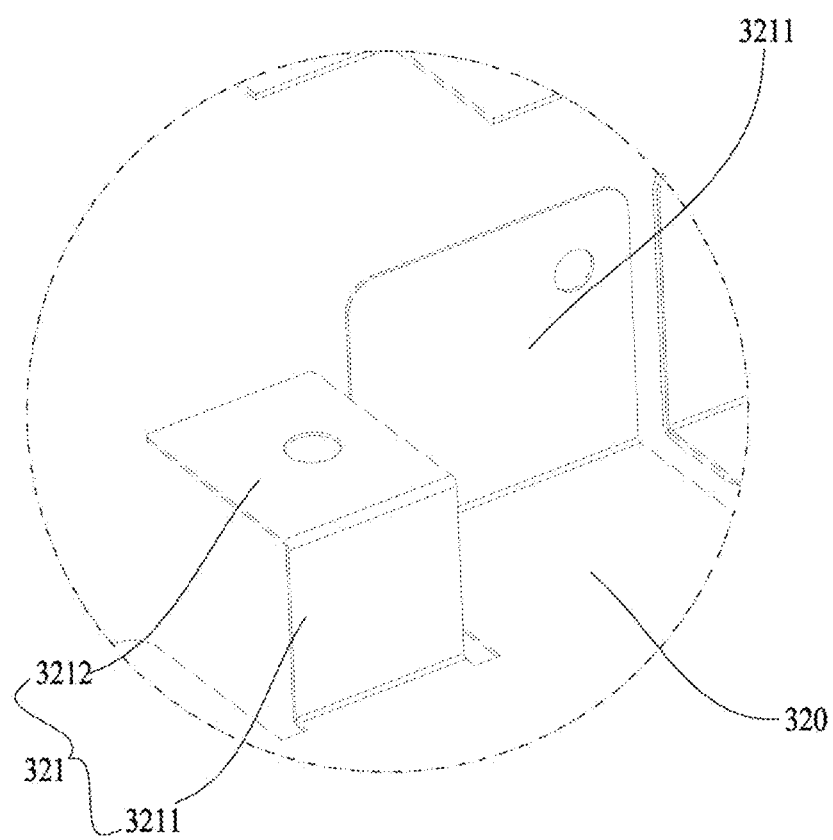
FIG. 9 is a partially enlarged diagram at B of FIG. 4.
Figure 13:
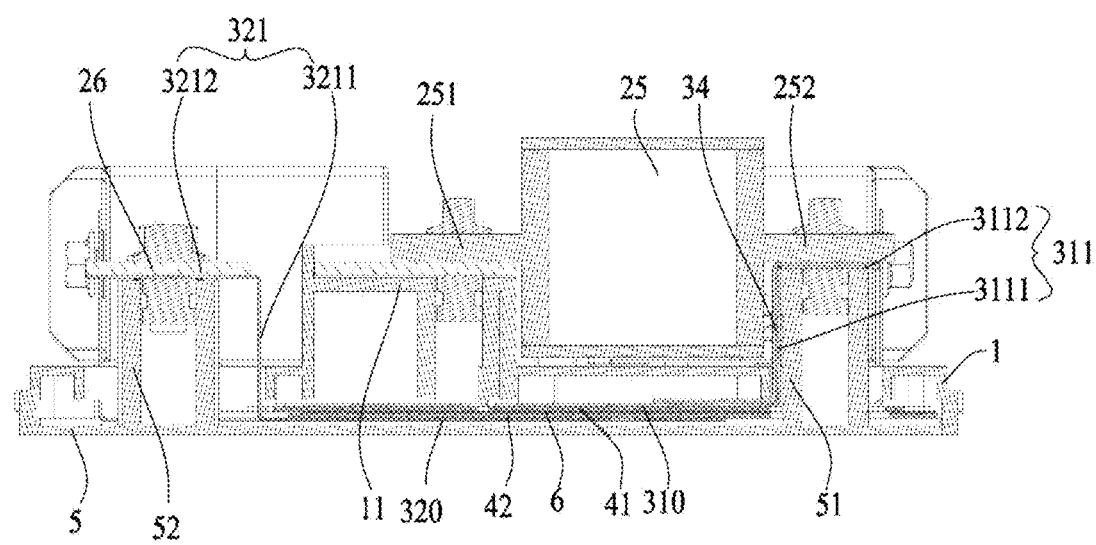
FIG. 13 is a planar sectional view at D-D of FIG. 11.
Figure 14:
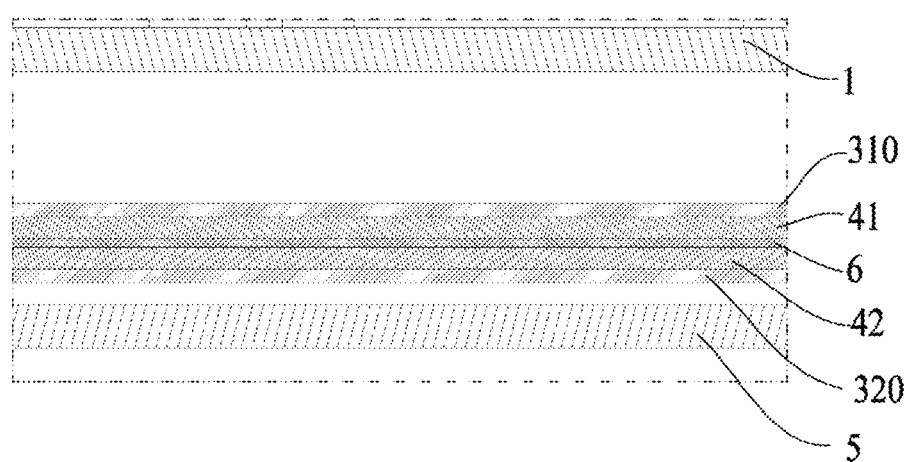
FIG. 14 is a partially enlarged diagram at E of FIG. 12.

Specifically, referring to FIG. 6, FIG. 7, and FIG. 13, a first conducting connection piece 34 is arranged between the first connection portions 311 electrically connected to the two electrical elements 2 on the first conducting bar 31, and two ends of the first conducting connection piece 34 are electrically connected to the electrical elements 2 respectively. A second conducting connection piece 35 is arranged between the second connection portions 321 electrically connected to the two electrical elements 2 on the second conducting bar 32, and two ends of the second conducting connection piece 35 are electrically connected to the electrical elements 2 respectively.

With the above technical solution, by the arrangement of the first conducting connection piece 34 and the second conducting connection piece 35, it is intended to increase conducting connection areas between the electrical elements 2 and the first conducting bar 31 as well as the second conducting bar 32, which can significantly reduce the internal resistance of the connection part, reduce heat accumulation, and improve the current transmission efficiency.

As some implementations, the first conducting connection piece 34 is in contact or not in contact with the surface of the first connection portion 311, the second conducting connection piece 35 is in contact or not in contact with the second connection portion 321, and when in a contact situation, due to the introduction of the conducting connection pieces, the effective conducting cross-sectional areas of the connection portions are increased, reducing the internal resistance of the current when it passes through, and thereby reducing the problem of energy loss and temperature rise due to the excessive internal resistance. When not in contact, since two ends of the first conducting connection piece 34 are electrically connected to the electrical elements 2 respectively, two ends of the second conducting connection piece 35 are electrically connected to the electrical elements 2 respectively, this is equivalent to adding an additional conducting path based on the original connection portions. This can effectively improve the conduction efficiency of the current when passing through these connection points, reducing contact resistance and heat accumulation.

The first conducting connection piece 34 and the second conducting connection piece 35 are arranged between the connection portions of the first conducting bar 31 and the second conducting bar 32, the solution not only optimizes the electrical connection between the electrical elements 2 and the conducting bars, improves the current transmission efficiency, and reduces the internal resistance, but also effectively improves the heat dissipation ability, controls the temperature rise, and realizes the temperature homogenization of the electrical elements 2. Compared with a method of increasing a thickness of a conducting bar, increasing the conducting connection pieces can achieve a purpose of optimizing current conduction and heat dissipation without increasing vertical space occupation, and at the same time meet the lightweight design requirements.

In order to realize the need for high-voltage sampling of a relay element, the following technical solution is introduced in this embodiment.

As some implementations, the first conducting piece body 310 has at least one vertically arranged first pin 312, the second conducting piece body 320 has at least one vertically arranged second pin 322, a surface of the upper shell body 1 has at least one connection seat 13, and referring to FIG. 5, FIG. 10, and FIG. 12, the first pin 312 and the second pin 322 are located in the connection seat 13 for making a connection with a high-voltage sampling terminal.

Adopting the above technical solution, the first pin 312 may be formed by stamping and bending on the first conducting piece body 310, the second pin 322 may be formed by stamping and bending on the second conducting piece body 320, the first pin 312 and the second pin 322 both vertically upwards penetrate through the surface of the upper shell body 1 and are fixed in the connection seat 13, thus, it is convenient to insert the external high-voltage sampling terminal into the connection seat 13, the sampling terminal is electrically connected to the first pin 312 and the second pin 322 to obtain a high-voltage signals of the relay, and such a structural design makes a manner of obtaining a high-voltage sampling model of the relay simple and reliable.

In this embodiment, due to the low thicknesses of the first conducting bar 31 and the second conducting bar 32, the thicknesses of the first pin 312 and the second pin 322 formed by stamping are perfectly matched to a sampling terminal interface, ensuring that there is no gap or poor contact during insertion, at the same time a production process is simple, there is no need to independently arrange a wire harness or a copper bar during high-voltage sampling, so that a manufacturing process is simple, and production and assembly are highly efficient.

Figure 11:
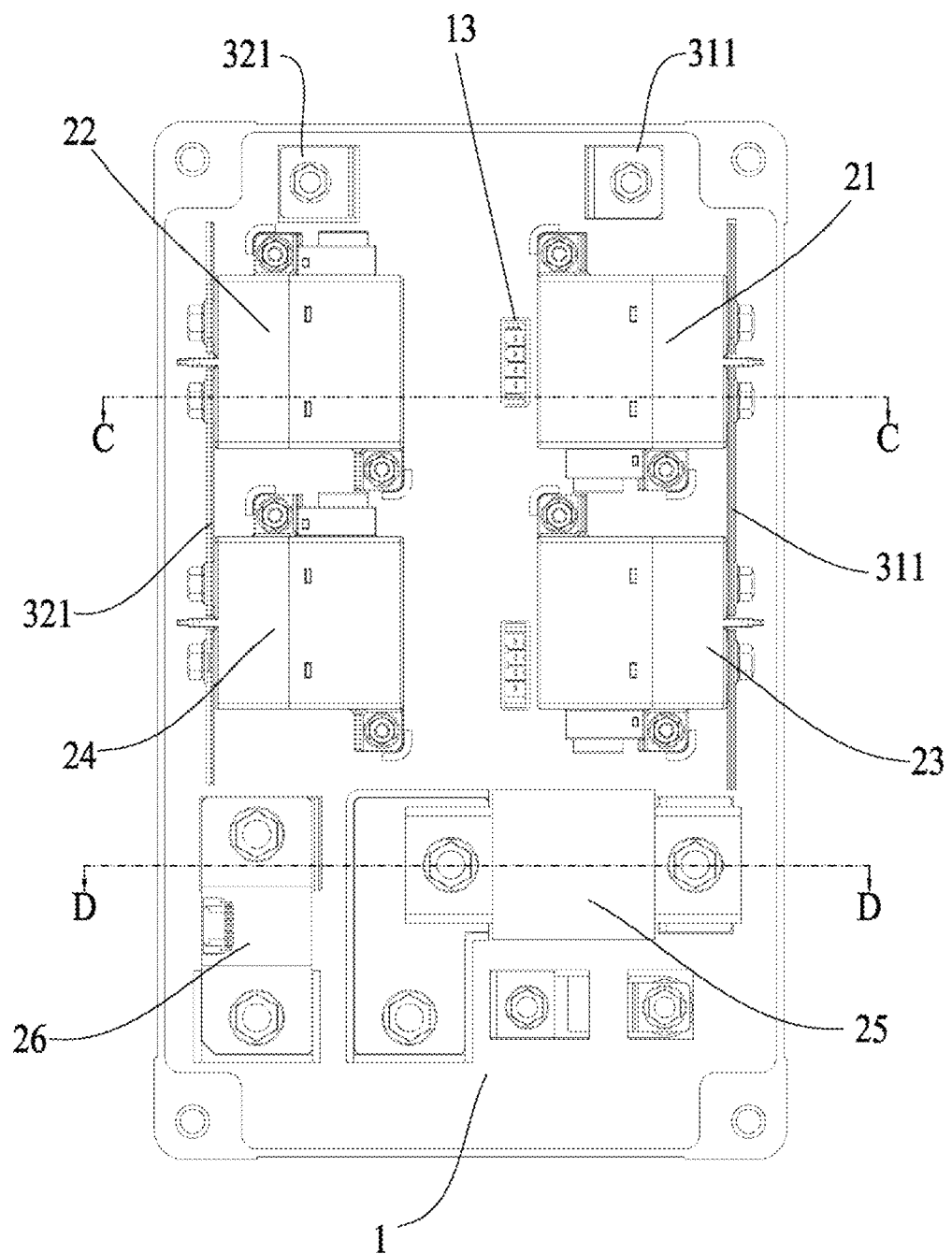
FIG. 11 is a top view of a battery disconnect unit disclosed by the present application.

The electrical element 2 of this embodiment includes a plurality of relays, referring to FIG. 1, FIG. 11, and FIG. 12, and as preferred, the plurality of relays are fixedly arranged on the surface of the upper shell body 1 in a flat lying manner. Compared with a conventional vertical mounting manner, such a design helps to reduce the space occupied by the electrical element 2 in the vertical direction in the battery disconnect unit, which may effectively reduce the overall volume of the battery disconnect unit and realize a light and thin design.

The relay has electric connection points, and the number of the electric connection points is 2, respectively a positive electric connection point and a negative electric connection point, for electric connections with other electrical elements 2. In this embodiment, when the relay is in a flat lying arrangement, the electric connection point P of the relay is located on a side wall, and the side wall of the relay having the electric connection point is close to the edge of the upper shell body 1. In this way, the arrangement of the electrical element 2 is optimized, so that the first connection portion 311 and the second connection portion 321 can be directly and effectively connected to the electric connection point P of the relay, which reduces unnecessary line lengths and connection delays and improves the overall electrical performance.

Referring to FIGS. 5, 6, 8, 9, 12, and 13, the first connection portion 311 includes a first vertical piece body 3111 connected to the first conducting piece body 310, the first vertical piece body 3111 may be perpendicularly connected to the first conducting piece body 310 by welding, or may be formed from the first conducting piece body 310 through bending by a stamping process. Such a manufacturing process is simple, efficient, and low-cost, and at the same time, the use of the stamping process ensures that the first conducting piece body 310 and the first vertical piece body 3111 belong to an integrally molded structure, which improves the structural stability and the firmness of the electrical connection.

The second connection portion 321 includes a second vertical piece body 3211 connected to the second conducting piece body 320, and in this embodiment, the second vertical piece body 3211 is made in the same manner as the first vertical piece body 3111, which will not be repeated herein.

The structural manner of the first connection portion 311 and the second connection portion 321 illustrated in this embodiment are both formed by a stamping process, i.e., they are directly formed by stamping and bending the first conducting piece body 310 and the second conducting piece body 320. In this way, the first vertical piece body 3111 and the second vertical piece body 3211 may penetrate through the surface of the upper shell body 1 at the edge of the upper shell body 1, thereby facilitating an electrical connection with the electric connection point P of the relay.

In this embodiment, of the plurality of relays, the electric connection points P of one part of the relays are electrically connected through the first vertical piece body 3111, and the electric connection points P of the other part of the relays are electrically connected through the second vertical piece body 3211.

Specifically, the plurality of relays includes a fast charging positive relay 21, a fast charging negative relay 22, a main positive relay 23, and a main negative relay 24, an electric connection point P of the fast charging positive relay 21 and an electric connection point P of the main positive relay 23 are electrically connected through a first vertical piece body 3111, and an electric connection point P of the fast charging negative relay 22 and an electric connection point P of the main negative relay 24 are electrically connected through a second vertical piece body 3211.

By designing the electric connections between the fast charging relays and the main relays as the first vertical piece body 3111 and the second vertical piece body 3211 respectively, more efficient current distribution may be realized. The fast charging relay is directly connected to the main positive relay 23 through the first vertical piece body 3111, which ensures a stable flow of a positive current during fast charging; and similarly, a negative current flows from the fast charging negative relay 22 to the main negative relay 24 through the second vertical piece body 3211, which avoids mutual interference of the currents or overloading.

This connection manner realizes effective electrical connections between different relays, and more efficient and stable and safer current distribution and charging management are realized by connecting the electric connection points of different relays through the first vertical piece body 3111 and the second vertical piece body 3211 respectively.

In the above embodiment, the first vertical piece body 3111 and the second vertical piece body 3211, after penetrating through the upper shell body 1, may be connected to the electric connection point of the side wall of the relay quickly, and in some preferred embodiments, the above first vertical piece body 3111 and the second vertical piece body 3211 may be fixedly and reliably connected to the electric connection point P of the relay by means of bolts.

It needs to be noted that when the electric connection point of the electrical element 2 is set at the side wall by arranging the first connection portion 311 in the structural form of the first vertical piece body 3111 and the second connection portion 321 in the structural form of the second vertical piece body 3211. In this way, the first vertical piece body 3111 and the second vertical piece body 3211 may penetrate through the surface of the upper shell body 1 conveniently, thereby facilitating electrical connections to the electric connection points of these electrical elements 2.

In this embodiment, preferably, the electrical element 2 is located at the top of the upper shell body 1, and the electric connection assembly 3 is located at the bottom of the upper shell body. Since the electric connection assembly 3 is located at the bottom of the upper shell body 1, the upper shell body 1 cannot provide full protection for the electric connection assembly 3. Especially the second conducting piece body 320 is in an exposed state, which may lead to contact disconnection between the second conducting piece body 320 and other electrical parts of the battery disconnect unit. In order to protect the electric connection assembly 3, the battery disconnect unit of this embodiment is further provided with a bottom shell 5 made of an insulating material, and the bottom shell 5 is arranged on a side of the electric connection assembly 3 away from the shell. In some embodiments, the bottom shell 5 may be embedded in the upper shell body 1 and fixedly connected to the upper shell body 1 by means of a snap connection, a bolt connection, gluing, or the like, so as to accommodate the electric connection assembly 3 and an insulating heat dissipation member between the upper shell body 1 and the bottom shell 5, thereby providing effective protection.

In this embodiment, referring to FIGS. 3, 4, and 12, the bottom shell 5 is provided with a number of first connection columns 51 and second connection columns 52. The first connection columns 51 and the second connection columns 52 all penetrate through the first conducting piece bodies 310, the second conducting piece bodies 320, and the upper shell body 1 and extend out of a top face of the upper shell body 1. Accordingly, the first conducting piece bodies 310 and the second conducting piece bodies 320 are provided with up and down corresponding avoidance holes which correspond to the holes 10 of the upper shell body 1 for these first connection columns 51 and second connection columns 52 to penetrate through.

In addition, the insulating layer 4 and the heat dissipation layer 6 also need to be provided with avoidance holes for these first connection columns 51 and second connection columns 52 to penetrate through.

By arranging the above first connection columns 51 and second connection columns 52, it is convenient for a case in which the electric connection points of some electrical elements 2 are set in the horizontal direction, such as a fuse 25 and a current sensor 26, and the electric connection points of these electrical elements 2 can be only electrically connected in the vertical direction to the first connection portions 311 or the second connection portions 321. Therefore, by arranging the first connection columns 51 and second connection columns 52, it is convenient to place the electric connection points of these electrical elements 2 horizontally on the above connection columns, on the one hand, these connection columns may support and fix the electric connection points of the electrical elements 2, On the other hand, the first connection portions 311 and the second connection portions 321 may also be placed on the connection columns so as to realize electrically fixed connections with the electric connection points of the above electrical elements 2.

The first connection columns 51 and the second connection columns 52 are arranged to support the first connection portions 311 and the second connection portions 321, so that the electric connection points of the electrical elements 2 may be conveniently placed on the first connection portions 311 or the second connection portions 321 and locked and fixed by the connection columns.

In this embodiment, at least a part of the first connection portions 311 further includes a first horizontal piece body 3112, the first horizontal piece body 3112 is perpendicularly connected to an end of the first vertical piece body 3111 away from the first conducting piece body, and the first horizontal piece body 3112 is fixedly connected to the top face of the first connection column 51. With this arrangement, electric connection points of some electrical elements 2 that need to be connected to the positive circuit may be placed on the top face of the first horizontal piece body 3112, and fixedly connected to the first connection column 51 by a bolt penetrating through the electric connection points and the first horizontal piece body 3112, thus, these electrical elements 2 can be effectively fixed on the top face of the upper shell body 1 while realizing that the electric connection points of these electrical elements 2 establish positive electrical communication with other electrical elements 2 through the first connection portion 311 with the first horizontal piece bodies 3112 and the first vertical piece bodies 3111.

Accordingly, at least a part of the second connection portions 321 further includes a second horizontal piece body 3212, the second horizontal piece body 3212 is perpendicularly connected to an end of the second vertical piece body 3211 away from the second conducting piece body 320, and the second horizontal piece body 3212 is fixedly connected to the top face of the second connection column 52. With this arrangement, electric connection points of some electrical elements 2 that need to be connected to the negative circuit may be placed on the top face of the second horizontal piece body 3212, and fixedly connected to the second connection column 52 by a bolt penetrating through the electric connection points and the second horizontal piece body 3212, thus, these electrical elements 2 can be effectively fixed on the top face of the upper shell body 1 while realizing that the electric connection points of these electrical elements 2 establish negative electrical communication with other electrical elements 2 through the second connection portions 321 with the second horizontal piece bodies 3212 and the second vertical piece bodies 3211.

In this embodiment, an opening area of the holes 10 in the upper shell body 1 is larger than projection areas of the first horizontal piece body 3112 and the second horizontal piece body 3212 in the vertical direction, whereby the first horizontal piece body 3112 and the second horizontal piece body 3212 are located above the upper shell body after the first vertical piece body 3111 and the second vertical piece body 3211 respectively penetrate through these holes 10, there is spacing between the first horizontal piece body 3112 as well as the second horizontal piece body 3212 and the surface of the upper shell body, after the first connection column 51 and the second connection column 52 penetrate through these avoidance holes, the first connection column 51 can support the first horizontal piece body 3112, and the second connection column 52 can support the second horizontal piece body 3212, facilitating the electric connection points horizontally arranged of the electrical elements 2 being able to fall on the surface of the first horizontal piece body 3112 or the second horizontal piece body 3212 and being connected in a locked manner by bolts.

It needs to be noted that in the embodiment of the present application, not all of the first connection portions 311 have a first horizontal piece body 3112, when the electric connection points of the electrical elements 2 are on the sidewalls, for example, a relay arranged in a flat-laying manner, then the first connection portions 311 connected to these electrical elements 2 have only first vertical piece bodies 3111, and the first vertical piece bodies 3111 are directly attached to the electric connection points on the sidewalls of the electrical elements 2 and are electrically connected. Only when the electric connection point of the electric element 2 is in set horizontally and needs to be connected to the first connection portion 311 in a vertical direction, such as a fuse 25, the first connection portion 311 has a first vertical piece body 3111 and a first horizontal piece body 3112.

Accordingly, not all of the second connection portions 321 are provided with a second horizontal piece body 3212, which are arranged similarly to the first connection portions 311.

In addition, a part of the first horizontal piece bodies 3112 are fixedly connected to the top faces of the first connection columns 51, a part of the second horizontal piece bodies 3212 are fixedly connected to the top faces of the second connection columns 52, so that it may be convenient to fixedly connect the first horizontal piece body 3112, whose fast charging positive input end is connected to the fast charging positive relay 21, to the first connection column 51, and the second horizontal piece body 3212, whose fast charging negative input end is connected to the fast charging negative relay 22, is fixedly connected to the second connection column 52 to realize that the fast charging positive and negative input ends are connected into the charging circuit.

In some implementations, the electrical element 2 further includes at least one fuse 25, the fuse 25 has a first electric connection end 251 and a second electric connection end 252 arranged opposite to each other, a top face of the upper shell body 1 has a first support portion 11, the first electric connection end 251 of the fuse 25 is fixedly arranged on the first support portion 11, the second electric connection end 251 of the fuse 25 is arranged on a top face of the first horizontal piece body 3112, and the second electric connection end 252 is fixedly connected to the first horizontal piece body 3112 through the first connection column 51.

In the above embodiment, the first electric connection end 251 and the second electric connection end 252 are formed by copper bars protruding horizontally from two ends of a body of the fuse 25 respectively, the first electric connection end 251 is fixed horizontally to the first support portion 11, and the first electric connection end 251 is configured to be connected to a positive end of the battery pack or a positive end of an electrical appliance.

In some embodiments, the fuse 25 may include only a main fuse, and a fast charging positive circuit is established between the fast charging positive relay 21, the main positive relay 23, and the main fuse through the first conducting bar 31 respectively, and a fast charging negative circuit is established between the fast charging negative relay 22 and the main negative relay 24 through the second conducting bar 32, so that the fast charging positive circuit, the battery pack, and the fast charging negative circuit are connected to form a complete fast charging closed circuit.

In some other implementations, the fuse 25 may also include at least one auxiliary fuse.

In the positive discharging circuit, the main fuse and the main positive relay 23 are connected in series with each other through the first conducting bar 31, the main positive relay 23 and the at least one auxiliary fuse are connected in parallel with each other through the first conducting bar 31, thereby forming a positive discharging loop of the battery pack, and a current flows through the loop. The positive current of the battery pack first passes through the main fuse 25a, then flows through the main positive relay 23, then passes through the auxiliary fuse (in parallel path if a plurality of auxiliary fuses are present), then flows to the positive end of an electrical device, and after passing through the negative end of the electrical device, finally flows back to the negative end of the battery pack through the main negative relay 24.

The second electric connection end 252 of the main fuse establishes an electrical connection with the main positive relay 23 through the first horizontal piece body 3112 and the first vertical piece body 3111 forming the first connection portion 311, and the first electric connection end 251 of the main fuse is configured to be connected to the positive end of the battery pack. A first electric connection end 251 of the auxiliary fuse is connected to the positive end of the electrical device through the first support portion 11, and a second electric connection end 252 of the auxiliary fuse is electrically connected to an electric connection point at a distal end of the main positive relay 23 through the first connection portion 311.

In the above embodiment, during a charging or discharging process of the battery pack, if too high a current occurs, the main fuse will fuse due to the excessive current, so that the current flow is cut off to avoid the battery pack, the electrical device, or the relay from overheating or being damaged. The safety redundancy of a circuit system may be enhanced by arranging the auxiliary fuse, i.e., when the main fuse is not disconnected in the event of too high a current, the circuit may be disconnected by the auxiliary fuse, thus protecting electrical safety.

The electrical element 2 further includes a current sensor 26, a top face of the upper shell body 1 has a second support portion 12, one end of the current sensor 26 is horizontally fixed to the second support portion 12, the other end of the current sensor 26 is horizontally arranged on a top face of the second horizontal piece body 3212, and the end of the current sensor 26 away from the second support portion 12 is fixedly connected to the second horizontal piece body 3212 through the second connection column 52. In this embodiment, one end of the current sensor 26 is connected to the negative end of the battery pack through the second support portion 12, and the other end of the current sensor 26 establishes an electrical connection with the main negative relay 24 through the second connection portion 321 formed by the second horizontal piece body 3212 and the second vertical piece body 3211. A negative discharging circuit is formed between the current sensor 26 and the main negative relay 24 through the second conducting bar 32, and a fast charging negative discharging circuit is formed between the fast charging negative relay 22, the main negative relay 24, and the current sensor 26 through the second conducting bar 32. The current sensor 26 is configured to detect the charging and discharging currents, and when the currents are overloaded, the fuse 25 may be activated to protect the safety of the charging and discharging circuits.

In the above embodiment, by arranging the first connection column 51 and the second connection column 52 on the bottom shell 5, it is ensured that at least one electric connection end of some electrical elements 2 can be stably connected to the bottom shell 5 through the above connection columns, and at the same time the structural forms of some of the first connection portions 311 and the second connection portions 321 are adjusted. Different types of electrical elements 2 may be flexibly electrically connected, and it is convenient to establish an assembly connection relationship between the electrical elements 2 through the first connection portions 311 and the second connection portions 321, so that the electrical elements 2 may be flexibly assembled in the battery disconnect unit.

The above is only optional implementations of the present application and are not used for limiting the present application, and any modification, equivalent replacement, improvement, etc. made within the spirit and principle of the present application should be included in the scope of protection of the present application.

What is claimed is:

1. A battery disconnect unit, comprising:
   electrical elements;
   an electric connection assembly, comprising first conducting bars and second conducting bars, wherein a number of first conducting bars and a number of second conducting bars are arranged, the first conducting bar comprises a first conducting piece body and a first connection portion connected to the first conducting piece body, the second conducting bar comprises a second conducting piece body and a second connection portion connected to the second conducting piece body, a number of the first conducting piece bodies are arranged at intervals on the same planar layer, a number of the second conducting piece bodies are arranged at intervals on the same planar layer, the planar layer where the first conducting piece bodies are located and the planar layer where the second conducting piece bodies are located are set in a stacked manner, and the first connection portions and the second connection portions are electrically connected to the electrical elements respectively; and
   an upper shell body, wherein the upper shell body has a hole, the plurality of electrical elements are arranged, the plurality of electrical elements are fixedly arranged at intervals on one side of the upper shell body, the first conducting piece bodies and the second conducting piece bodies are located on the other side of the upper shell body, and the first connection portions and the second connection portions are electrically connected to the electrical elements through the hole respectively.

2. The battery disconnect unit according to claim 1, wherein an insulating layer is arranged between the first conducting piece body and the second conducting piece body.

3. The battery disconnect unit according to claim 2, wherein a heat dissipation layer is further arranged between the first conducting piece body and the second conducting piece body, the insulating layer comprises an upper insulating layer and a lower insulating layer, and the heat dissipation layer is located between the upper insulating layer and the lower insulating layer.

4. The battery disconnect unit according to claim 1, wherein a thickness of both the first conducting piece body and the second conducting piece body is 0.3 mm-3 mm.

5. The battery disconnect unit according to claim 1, wherein an auxiliary conducting piece is fixedly arranged at an electrical connection of each first connection portion or each second connection portion and the corresponding electrical element.

6. The battery disconnect unit according to claim 1, wherein
   a first conducting connection piece is arranged between the first connection portions electrically connected to the two electrical elements on the first conducting bar, and two ends of the first conducting connection piece are electrically connected to the electrical elements respectively; and
   a second conducting connection piece is arranged between the second connection portions electrically connected to the two electrical elements on the second conducting bar, and two ends of the second conducting connection piece are electrically connected to the electrical elements respectively.

7. The battery disconnect unit according to claim 1, wherein the first conducting piece body has at least one vertically arranged first pin, the second conducting piece body has at least one vertically arranged second pin, a surface of the upper shell body has at least one connection seat, and the first pin and the second pin both penetrate through the upper shell body and are located in the connection seat.

8. The battery disconnect unit according to claim 1, wherein the first connection portion comprises a first vertical piece body connected to the first conducting piece body, the second connection portion comprises a second vertical piece body connected to the second conducting piece body, each electrical element comprises a plurality of relays, and the first vertical piece body and the second vertical piece body are electrically connected to electric connection points of the relays respectively when the electric connection points of the relays are located on a side wall.

9. The battery disconnect unit according to claim 8, further comprising a bottom shell, wherein the bottom shell is arranged on a side of the electric connection assembly away from the upper shell body, the bottom shell is provided with a plurality of first connection columns and second connection columns, and the first connection columns and the second connection columns all penetrate through the first conducting piece bodies, the second conducting piece bodies, and the upper shell body and extend out of an outer side of the upper shell body;
   at least part of the first connection portions further comprises a first horizontal piece body, the first horizontal piece body is perpendicularly connected to an end of the first vertical piece body away from the first conducting piece body, and the first horizontal piece body is fixedly connected to an end face of the first connection column; and
   at least part of the second connection portions further comprises a second horizontal piece body, the second horizontal piece body is perpendicularly connected to an end of the second vertical piece body away from the second conducting piece body, and the second horizontal piece body is fixedly connected to an end face of the second connection column.

10. The battery disconnect unit according to claim 9, wherein each electrical element further comprises at least one fuse, the fuse has a first electric connection end and a second electric connection end arranged opposite to each other, a surface of the upper shell body has a first support portion, the first electric connection end is fixedly arranged on the first support portion, the second electric connection end is arranged on a top face of the first horizontal piece body, and the second electric connection end is fixedly connected to the first horizontal piece body through the first connection column.

11. The battery disconnect unit according to claim 9, wherein each electrical element further comprises a current sensor, a surface of the upper shell body has a second support portion, one end of the current sensor is horizontally fixed to the second support portion, the other end of the current sensor is horizontally arranged on a top face of the second horizontal piece body, and the end of the current sensor away from the second support portion is fixedly connected to the second horizontal piece body through the second connection column.

* * * * *